United States Patent [19]
Jin et al.

[11] Patent Number: 5,909,706
[45] Date of Patent: Jun. 8, 1999

[54] SUPPORT TABLE FOR SUPPORTING A MODULE BOARD AND SCREEN PRINTING METHOD USING THE SAME

[75] Inventors: Jong Man Jin; Sung Ho Moon; Jong Jin Park, all of Asan, Rep. of Korea

[73] Assignee: Samsung Electronics Co., Ltd., Suwon, Rep. of Korea

[21] Appl. No.: 09/019,123

[22] Filed: Feb. 5, 1998

[30] Foreign Application Priority Data

Apr. 8, 1997 [KR] Rep. of Korea ................. 97-12796

[51] Int. Cl.$^6$ .................................................. B05C 17/06
[52] U.S. Cl. ......................... 101/126; 101/129; 269/903
[58] Field of Search ................... 101/114, 123, 101/126, 129, 485, 486; 269/903; 118/213, 301, 406, 500; 427/96, 97, 282, 404, 409

[56] References Cited

U.S. PATENT DOCUMENTS

| | | | |
|---|---|---|---|
| 3,680,193 | 8/1972 | Scaminaci, Jr. et al. | 269/903 |
| 4,444,101 | 4/1984 | Weiner et al. | 101/126 |
| 4,700,935 | 10/1987 | Winslow et al. | 269/903 |
| 4,720,034 | 1/1988 | Lee | 269/903 |
| 5,139,924 | 8/1992 | Svensson | 427/96 |
| 5,368,883 | 11/1994 | Beaver | 101/129 |
| 5,394,796 | 3/1995 | Jones et al. | 101/126 |
| 5,660,638 | 8/1997 | Amano et al. | 269/903 |

*Primary Examiner*—Ren Yan
*Attorney, Agent, or Firm*—Jones, Volentine, Steinberg & Whitt, L.L.P.

[57] ABSTRACT

A support table supports a module board during a screen printing thereof. The support table has a body in which rectangular grooves are formed in both upper and lower surfaces thereof, a plurality of slots formed in a middle portion thereof and open to the grooves, and a plurality of jigs which are inserted into the slots and fixed relative to the body. The jigs can compensate for any difference between the heights of semiconductor devices which are mounted on the board, and support the board, with the board or the semiconductor devices resting directly on the jigs as the manufacture process at that time requires. The screen printing method includes steps of (a) preparing the support table by inserting appropriate ones of the jigs in the slots of the body of the support table; (b) disposing a board, having a plurality of land patterns formed thereon, on the support table; (c) positioning a screen, which has hole patterns formed therein, over the board with the hole patterns aligned with the land patterns of the board; and (d) forcing lead material through the hole patterns of the screen and onto the land patterns of the board with a squeegee while the board is supported by the upper surface of the support table.

23 Claims, 13 Drawing Sheets

SUPPORT TABLE FOR SUPPORTING A MODULE BOARD AND SCREEN PRINTING METHOD USING THE SAME

BACKGROUND OF THE INVENTION

1. Field of the Invention

The present invention generally relates to a support table, and more particularly to a support table for supporting a board which is used in the manufacture of an electronic module and to a screen printing method using the same.

2. Description of the Related Art

Electronic apparatus and semiconductor products are gradually progressing toward becoming faster, smaller, and thinner in order to meet the pressing demands for miniaturization, high integration density and high operational speed. Further, a module which has a plurality of electrically linked integrated circuits (ICs) installed on a printed circuit board (PCB) is used to meet the demand for an IC having a large memory capacity.

Such a PCB can be produced by either of the following two methods. In the first method, a plurality of semiconductor devices are mounted on a single board, and then the single board is divided into a plurality of individual boards. In the second method, the semiconductor devices are mounted on individual boards after they have been divided out from a single board. That is to say, the step of dividing a board into a plurality of individual boards and the step of mounting the semiconductor devices on the boards can be carried out in any order.

The modules are classified as single-sided modules and double-sided modules. The single-sided module has a plurality of semiconductor devices mounted on only one side of a board, while the double-sided module has a plurality of semiconductor devices mounted on both sides of a board.

Usually, after a lead material is applied to land patterns of the board, the semiconductor devices are mounted on the lead. A screen printing method or a dispenser method is used to form the leads.

In the dispenser method, a syringe containing the lead material is compressed by air, whereby the lead material is ejected through a nozzle of the syringe. This method has an advantage in that it is not affected much by the lack of planarity of the board because the lead material is ejected though the nozzle. Also, the amount of the lead material emitted can be controlled by modifying the pressure of the compressed air, the emission period, the interior diameter of the nozzle, and the viscosity (centipoise) of the lead material. However, this method is not suitable for a fine lead-application step because it can not meet the requirements of mass-productivity or those for the manufacture of a multi-pin semiconductor device package.

On the other hand, the screen printing method has an advantage in that the lead material can be applied to the board all at once. In this method, a screen in which hole patterns are formed is in contact with part of the board. However, this method requires the board to be precisely planar, because the lead material is applied to the board which is in contact with the screen. The screen which is used in the screen print method can be either a mesh screen or a metal screen (also referred to as "a metal mask").

The hole patterns of the mesh screen are formed by applying an emulsion on a mesh of stainless wire, nylon, or tetron. The mesh has 80 to 100 hole patterns and such a mesh screen can advantageously be employed in connection with the manufacture of large boards. The thickness of the printed pattern depends on the thickness of the lead and the toughness or durability of the mesh.

The metal mask is expensive compared to the mesh screen, but has an advantage of high durability. Because finer hole patterns can be formed in the metal mask, it has an advantage in that it can apply leads on finer land patterns formed on the board. However, it has a disadvantage in that the restricted size of the metal mask limits the area in which printing can be carried out on the board.

Furthermore, in the lead application step using the screen, because a squeegee applies pressure to the board, a support table for maintaining the board planar and supporting the board is required.

Figure 1:
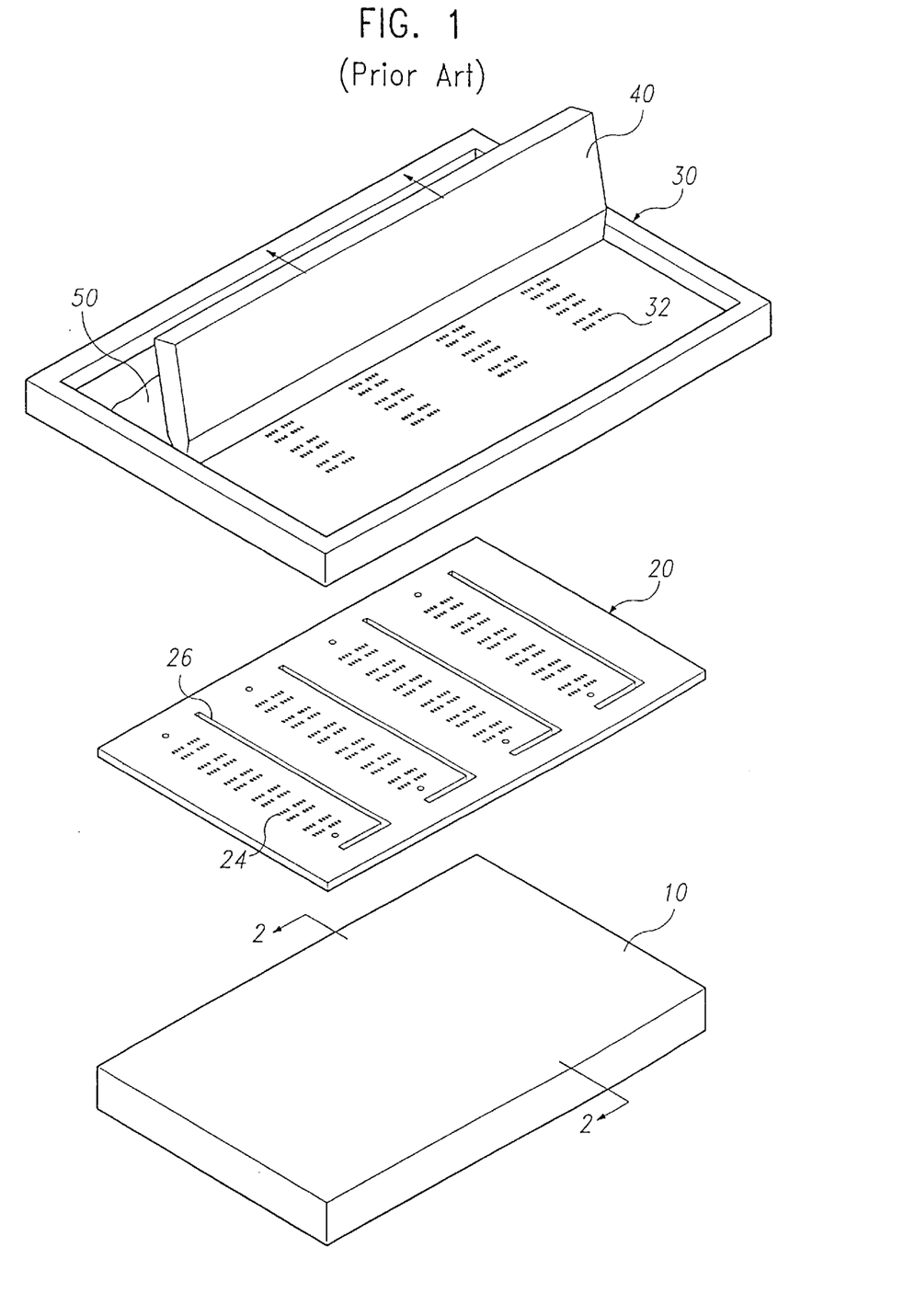
FIG. 1 is an exploded perspective view of a screen, a module board, and a conventional table which supports the board as it is being screen printed.
Figure 2:
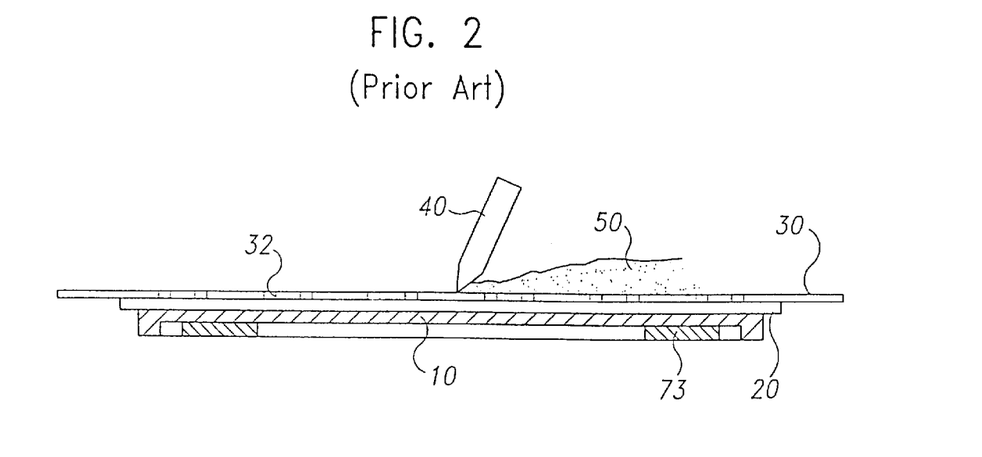
FIG. 2 is a cross-sectional view taken along line 2—2 in FIG. 1.

FIG. 1 depicts the screen printing of leads on one surface of a board which is resting on a conventional support table and FIG. 2 is a cross-sectional view taken along line 2—2 in FIG. 1.

Referring to FIG. 1 and FIG. 2, a conventional support table 10 for supporting a module board 20 has a planar top surface that receives a bottom surface of the board. The support table 10 prevents the board 20 from warping when the lead material 50 is applied to the board 20 during the screen printing step. Magnets 73 are attached to a bottom surface of the support table 10.

The board 20, which is devoid of semiconductor devices, is loaded on the support table 10. A screen 30 such as mesh or metal mask is disposed on the top surface of the board 20 and the creamy lead material 50 is applied to the board 20 by a squeegee 40. At this time, since the bottom surface of the board 20 is supported by the support table 10, the board 20 is prevented from warping.

The support table 10 is fixed to one surface of a driving device (not shown). The support table 10 is elevated by the driving device until the support table nears the screen 30 whereupon the lead material is applied to land patterns 24 already formed on the board 20. The support table 10 is fixed to the driving device by the magnets 73. The support table 10 is made of a non-magnetic material such as aluminum alloy.

A PCB (printed circuit board) is mainly used as the board 20. Generally, the board 20 is manufactured as a single body. Hole patterns 32 are formed in the screen 30. The screen 30 is placed on the board 20 with the hole patterns 32 aligned with the land patterns 24. The lead material 50 is applied onto the land patterns 24 of the board 20 through the hole patterns 32. Accordingly, after semiconductor devices are mounted to the leads, the board 20 is cut along scribing holes 26 to separate it into individual boards. In the present embodiment, land patterns 24 on which six (6) semiconductor devices 60 (FIG. 3) are mounted are formed per individual separated board 20. The semiconductor devices 60 are mounted on the resulting leads using a reflow solder process. The land patterns which receive other electronic components, such as capacitors or resistors, are omitted from the drawings for the sake of simplicity.

Figure 3:
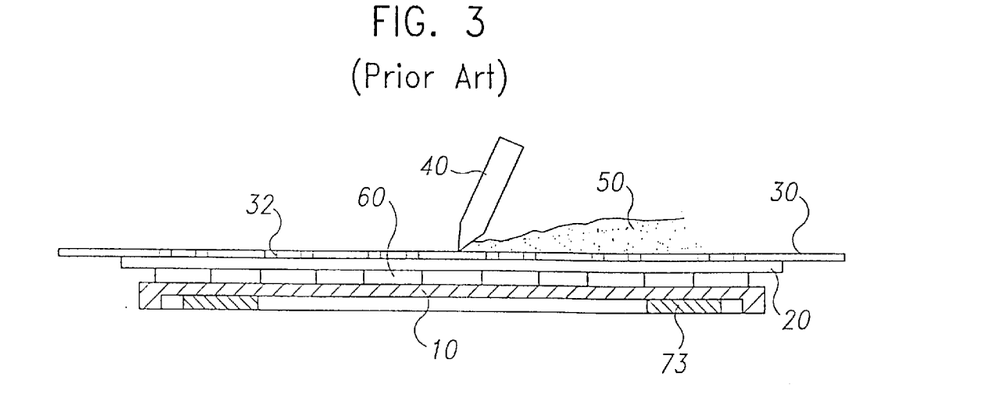
FIG. 3 is a cross-sectional view of the members shown in FIG. 1 depicting the screen printing of the other surface of the board, after semiconductor devices have been mounted on a first surface thereof.
Figure 4:
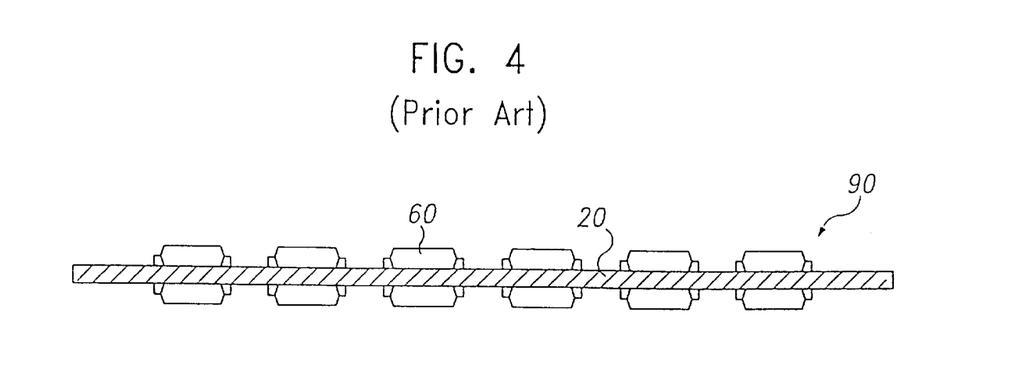
FIG. 4 is a cross-sectional view of a double-sided module produced by using the equipment shown in FIG. 3.

The mounting of semiconductor devices on the other surface of the board will now be described. FIG. 3 depicts the screen printing of leads on the other surface of the board, after semiconductor devices have been mounted on one surface of the board. FIG. 4 is a cross-sectional view of a double-sided module in which the semiconductor devices have been mounted on the other surface of the board.

Referring to FIG. 3 and FIG. 4, because the semiconductor devices 60 which are mounted on one surface of the board 20 have the same height, the support table 10 which is in contact with the semiconductor devices 60 has a planar top surface. That is to say, the support table 10 has a planar top surface which supports the semiconductor devices 60 having the same height. The bottom surfaces of the semiconductor devices 60 are in contact with the top surface of the support table 10. The support table 10 shown in FIG. 1 and FIG. 2 can be used in this case.

The lead material is applied to the other surface of the board 20 by the same process described in connection with FIG. 1 and FIG. 2, and the semiconductor devices 60 are mounted on the resulting leads by the reflow soldering process.

In the above-described embodiment, semiconductor devices having the same height were mounted on the board 20. However, as shown in FIG. 5 and FIG. 6, semiconductor devices having different heights also can be mounted on the board 20 to produce a double-sided module.

Figure 5:
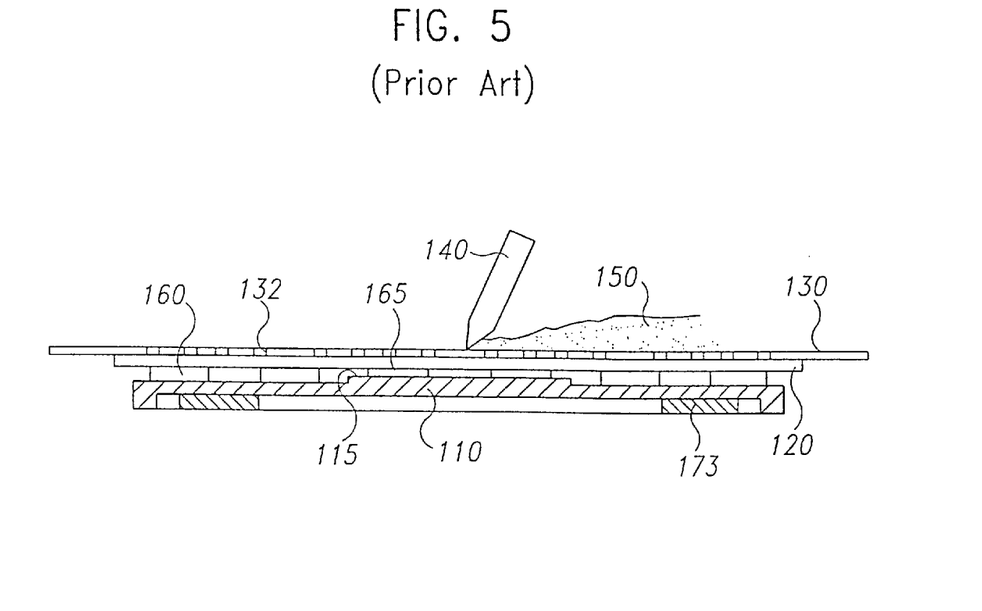
FIG. 5 is a cross-sectional view of another conventional support table, module board and screen, in a state in which semiconductor devices have already been mounted on one surface of the board.
Figure 6:
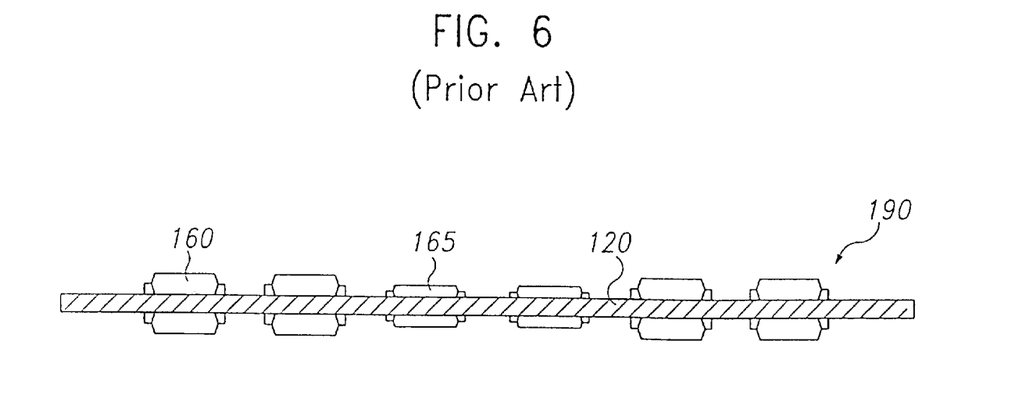
FIG. 6 is a cross-sectional view of another double-sided module produced using the equipment shown in FIG. 5.

Referring to FIG. 5 and FIG. 6, semiconductor devices 160, 165 which are mounted on one surface of a board 120 have different heights. The semiconductor devices 160 which are disposed to both sides of the board 20 have a greater height and are denoted as 'high semiconductor devices', whereas the semiconductor devices 165 which are disposed at the center of the board 120 have a smaller height and are denoted as 'low semiconductor devices'. A support table 110 has a projection 115 at the center thereof and on which the low semiconductor devices 165 are supported. Because the height of the low semiconductor devices 165 is less than that of the high semiconductor devices 160, the projection 115 is formed so as to compensate for the difference between the height of the high semiconductor devices 160 and the height of the low semiconductor devices 165. The height of the projection 115 is the same as the difference of the height between the high semiconductor devices 160 and the low semiconductor devices 165. The magnet 173 is attached to the bottom surface of the support table 110.

The projection 115 prevents the board 120 from warping because the support table 110 directly supports all of the semiconductor devices having different heights.

Note, although semiconductor devices 160, 165 having different heights were mounted on both surfaces of the board 120, semiconductor devices having the same height can also be mounted on one surface of the board 120 to produce a double-sided module.

As an example, the heights of semiconductor devices which are mounted on the board 120 are as follows:

SOJ (Small Outline Package)—about 3.6 mm;

TSOP (Thin Small Outline Package)—about 1.2 mm ; and

QFP (Qu ad Flat Package)—about 3.0 mm.

In manufacturing the above-described double-sided module, in the case of mounting semiconductor devices having the same height, the support table which has a planar top surface as shown in FIG. 1 and FIG. 2 is used. However, in the case of mounting semiconductor devices having different heights, the support table which has the projection as shown in FIG. 5 and FIG. 6 is used.

The prior art is problematic in that a support table must be newly produced when different semiconductor devices of different heights are to be mounted on the board. The cost for manufacturing a support table is very high. Therefore, this high cost becomes a significant part of the cost of producing the modules.

SUMMARY OF THE INVENTION

Accordingly, an object of the present invention is to provide a support table which can support a double-sided module as well as a single-sided module, and which can be used regardless of the heights of the semiconductor devices which are mounted on the board. Another object of the present invention is to provide a screen printing method which makes use of such a support table.

These and other objects are achieved by a support table for supporting a module board and which comprises: a body having rectangular grooves formed in both upper and lower surfaces thereof, and a plurality of slots formed in a middle portion thereof and open to the grooves. A plurality of jigs are inserted in the slots and are fixed in place relative to the body, wherein the jigs compensate for any difference between the heights of semiconductor devices which are mounted on a board disposed on the upper surface of the body.

In another aspect, the present invention provides a screen printing method using the support table for supporting a module board and comprising the steps of: (a) preparing a support table consisting of a body having rectangular grooves formed in upper and lower surfaces thereof, and a plurality of slots formed in a middle portion thereof and open to the grooves, and a plurality of jigs which are inserted into the slots and are fixed in place relative to the body; (b) disposing a board, on which a plurality of land patterns are formed, on the support table; (c) positioning a screen having hole patterns over the board such that the hole patterns are aligned with the land patterns of the board; (d) providing creamy lead material on the screen; and (e) using a squeegee to press the lead material through the hole patterns and onto the land patterns of the board, wherein the pressing of the lead material is carried out while the board or its semiconductor devices are supported in contact with the upper surface of the support table.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 7:
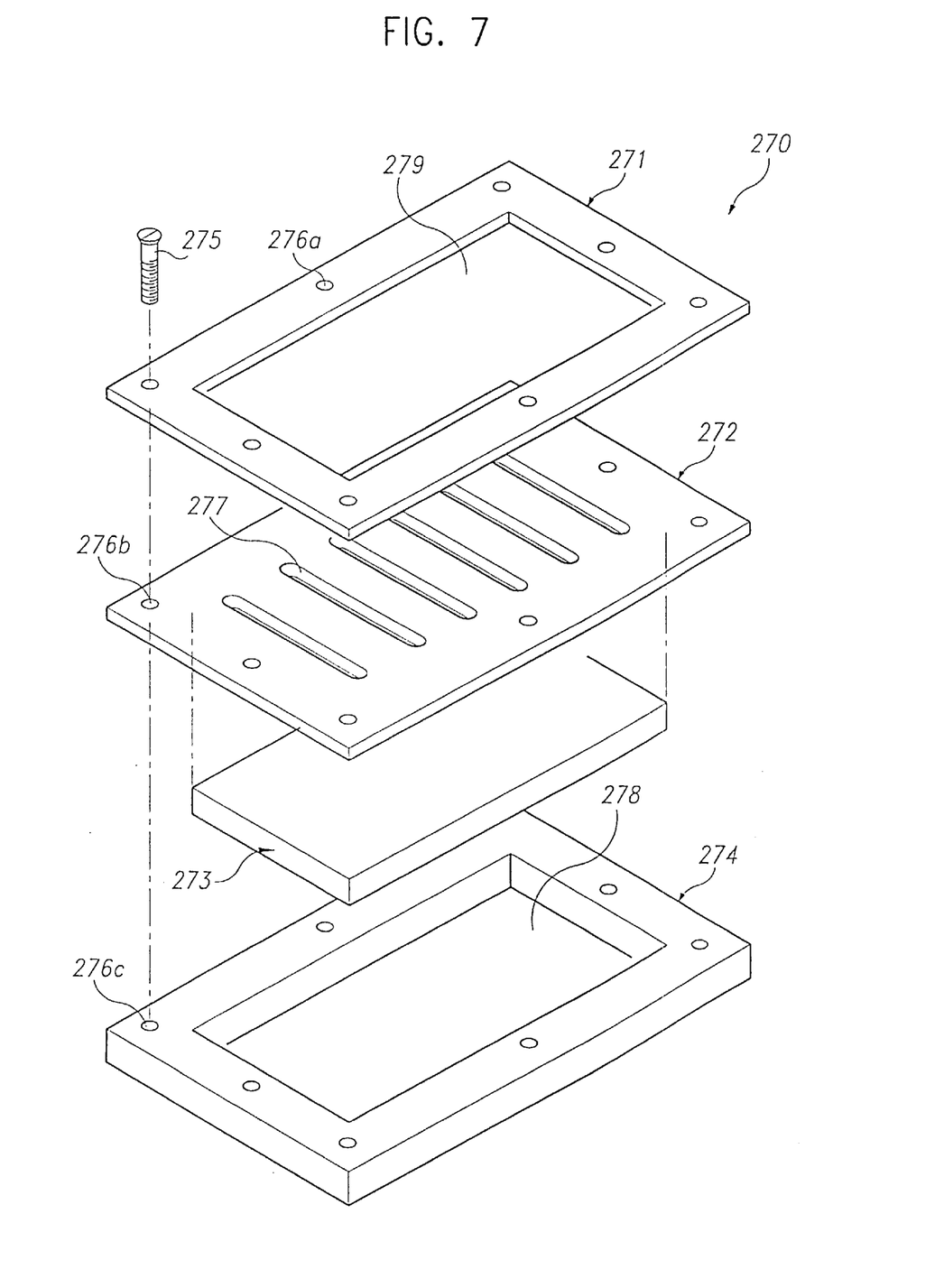
FIG. 7 is an exploded perspective view of the body of an embodiment of a support table according to the present invention.
Figure 8:
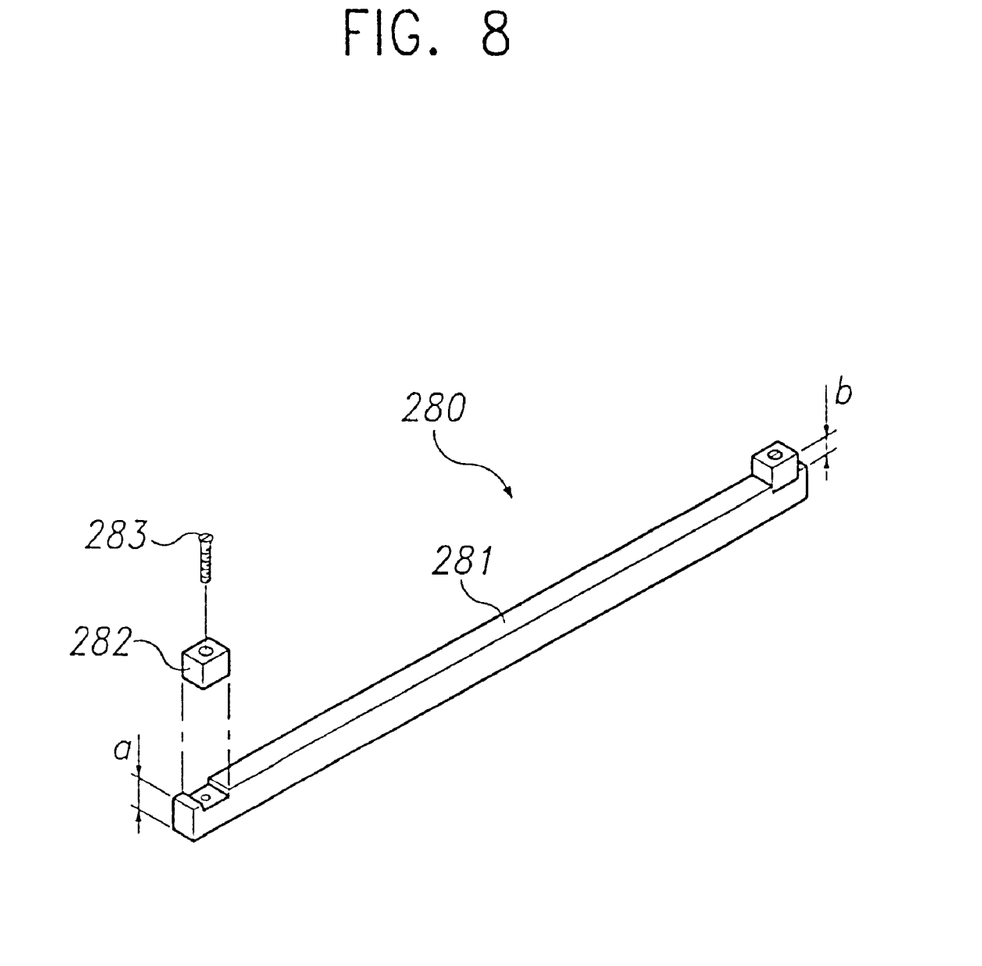
FIG. 8 is an exploded perspective view of a jig which will be inserted into slots of the body of the support table shown in FIG. 7.

Referring first to FIG. 7 and FIG. 8, the support table according to the present invention comprises a body 270 which has a plurality of slots 277, and a plurality of jigs 280 which will be inserted into the slots 277 and fixed in place relative to the body 270.

The body 270 of the support table consists of a lower member 274, a middle member 272, and an upper member 271. The lower member 274 has an outer portion defining a square opening 278, and a magnet 273. The middle member 272 is positioned on the lower member 274 and has a plurality of slots 277. The slots 277 are spaced apart and extend parallel to the shorter side of the middle member 272. The upper member 271 is positioned on the middle member 272 and has a square opening 279 for exposing the slots 277 of the middle member 272.

Connection holes 276c, 276b, 276a (collectively referred to as connection holes 276) are formed in the lower, middle, and upper members 274, 272, and 271 at corresponding positions. Therefore, once the lower, middle, and upper members 274, 272, and 271 are aligned, they can be connected and fixed together by connection means 275 such as screws. Three (3) connection holes 276 are formed along each side of a respective member. In the figure, although only one connection means 275 is shown, it is understood that a plurality of the connection means 275 are inserted into the connection holes 276, respectively.

The magnet 273 is attached to the lower surface of the middle member 272. The magnet 273 is big enough to encompass all of the slots 277 of the middle member 272, but is smaller than that of the opening 278 of the outer portion of the lower member 274. The thickness of the magnet 273 is the same as that of the outer portion of the lower member 274.

A non-magnetic aluminum alloy, such as Al6061, is used as the material of the body 270. Although the lower, middle, and upper members 274, 272, and 271 are integrated to form the body 270 after being manufactured separately, it is possible to integrally manufacture the lower, middle, and upper members 274, 272, 271 in forming the single body 270.

The jig 280 comprises a square-shaped rod 281 and support legs 282 which are mechanically connected to the bottom surface of the rod 281 by connection means 283 such as screws. The length of the rod 281 is less than a length of the opening 279 of the upper member 271. Each support leg 282 has a height 'b' which is the same as that of the slot 277 of the middle body 272. The material of the rod 281 is an aluminum alloy, for example Al6061, and the material of the support leg 283 is an iron alloy, for example, SKD-11. The height 'a' of the jig 280 depends on the height of the semiconductor device which is to be mounted on the board.

Figure 9:
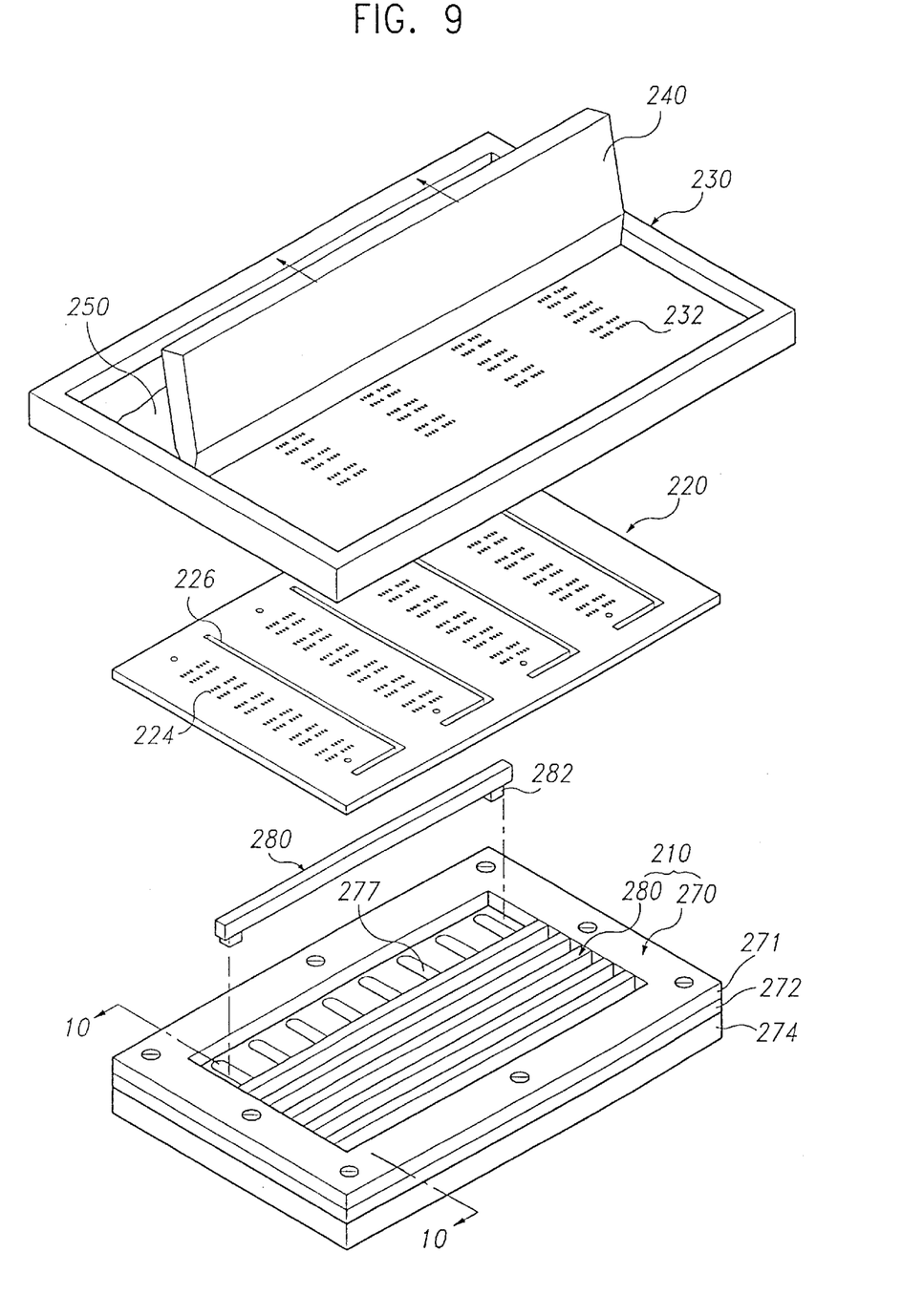
FIG. 9 is an exploded perspective view of an embodiment of equipment for screen printing a module board according to the present invention, the equipment including the support table shown in FIGS. 8 and 9 and a screen used to print a pattern on the module board as it is supported by the support table.
Figure 10:
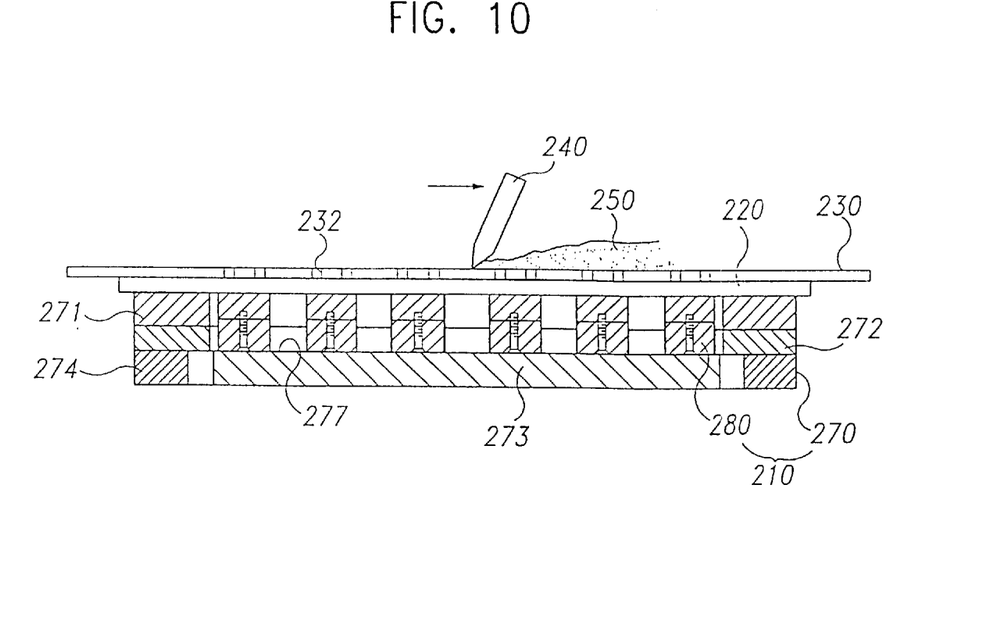
FIG. 10 is a cross-sectional view taken along line 10—10 in FIG. 9.
Figure 11:
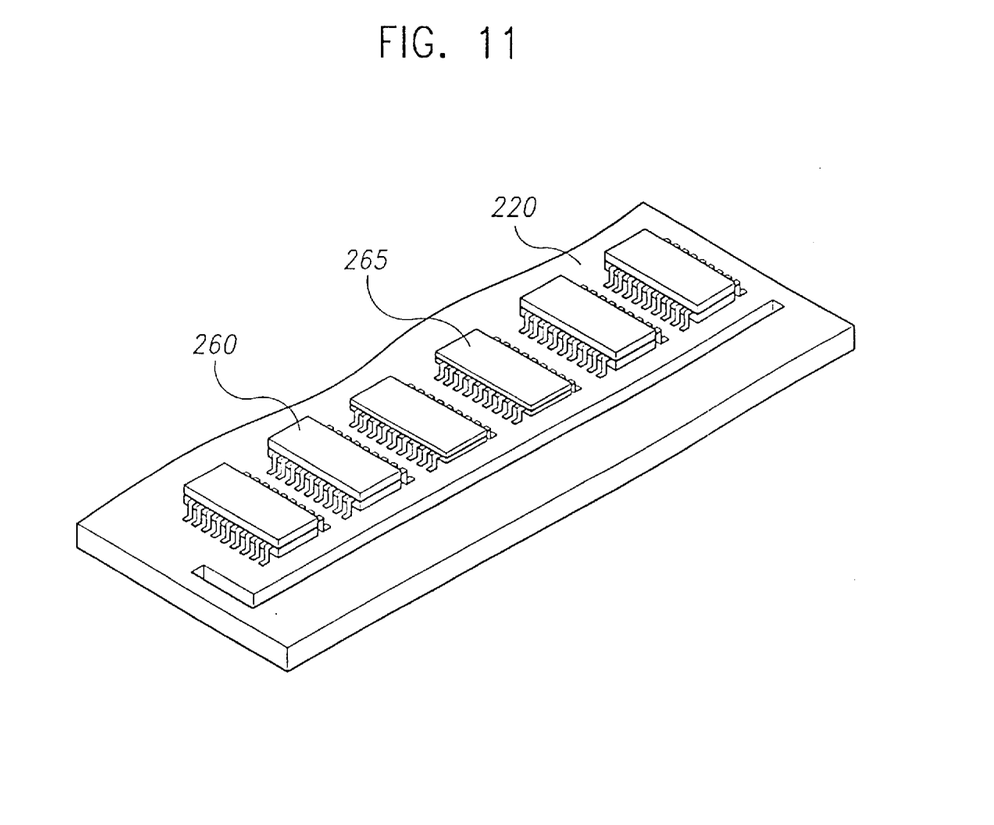
FIG. 11 is a perspective view of the module board once semiconductor devices have been mounted on one surface of the board.

Referring now to FIG. 9 through FIG. 11, the support legs 282 of the jigs 280 are inserted into the slots 277 of the middle member 272 through the opening 279 of the upper member 271 and are fixed to the body 270 by the magnet 273 which is attached to the lower surface of the middle member 277. Thus, the support table 210 is prepared. Each jig 280 has a height such that its upper surface is coplanar with the upper surface of the upper member 271. The jigs 280 support the lower surface of the board because none of the semiconductor devices are mounted on the board 220 yet. All the jigs 280 are the same height in this embodiment.

With the board 220 supported on the top surfaces of the upper member 271 and the jigs 280 of the support table 210, a screen 230 such as a mesh or metal mask is aligned on the upper surface of the board 220. After a creamy lead material 250 is provided on the screen 230, the lead material 250 is pressed through the hole patterns 232 and onto the land patterns 224 of the board 220 by a squeegee 240. At this time, because the board 220 is supported by the support table 210, even though the squeegee 240 applies pressure to the board 220, the board 220 is prevented from warping.

Further, after the lead material 250 is applied to the land patterns 224 of one surface of the board 220 to form leads, and semiconductor devices 260, 265 are aligned with such leads, the semiconductor devices 260, 265 are mounted to the surface of the board 220 by a reflow soldering process.

In this embodiment, six (6) semiconductor devices 260, 265 are mounted on one surface of the board 220. Of these devices, two (2) shorter semiconductor devices 265 are disposed centrally of four (4) taller semiconductor devices 260.

The support table 210 is fixed to one surface of a driving device (not shown). The support table 210 is elevated by the driving device until the support table 210 nears the screen 230. Once this occurs, the lead material 250 is applied to the board 220 which is resting on the support table 210. The support table 210 is fixed to the driving device by the magnet 273.

That is, the magnet 273 of the present invention is used for simultaneously fixing the body 270 of the support table 210 to one surface of the driving device and the jigs 280 to the upper surface of the middle member 272.

Figure 12:
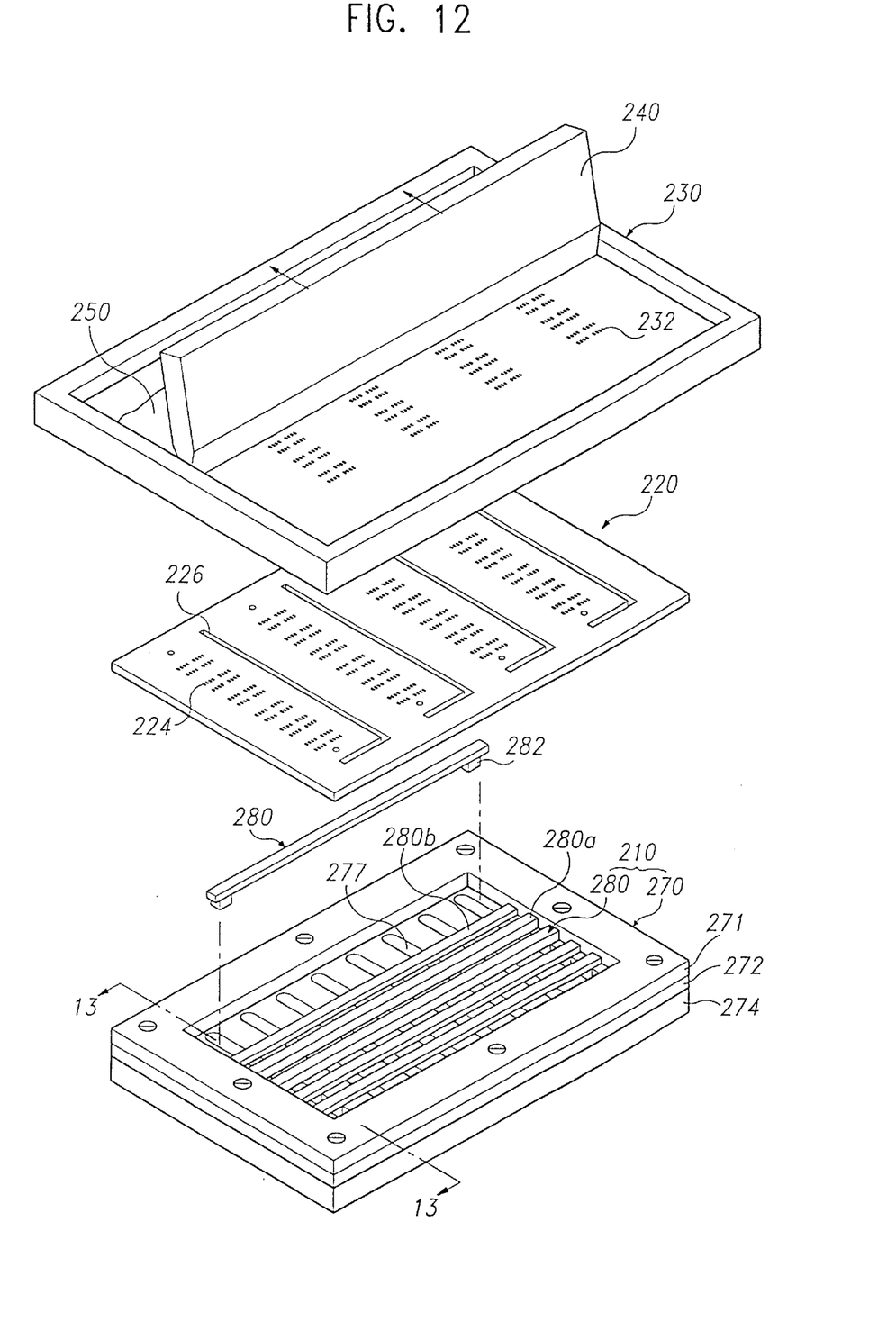
FIG. 12 is an exploded perspective view similar to that of FIG. 9 but showing a support table having a set of jigs adapted to support the module board shown in FIG. 11.
Figure 13:
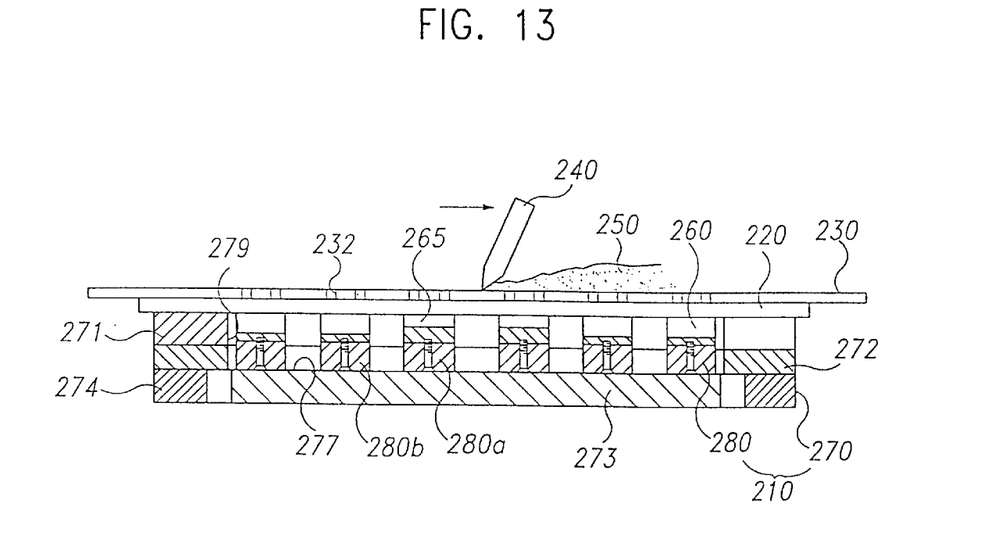
FIG. 13 is a cross-sectional view taken along line 13—13 in FIG. 12.
Figure 14:
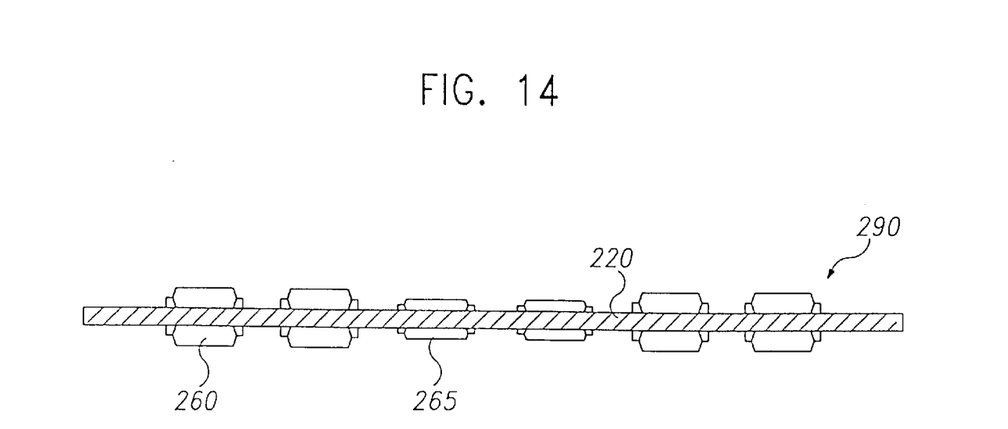
FIG. 14 is a cross-sectional view of the double-sided module board after semiconductor devices have been mounted on the other surface of the board.

Now referring to FIG. 12 through FIG. 14, two (2) shorter semiconductor devices 265 are still disposed centrally of the four (4) taller semiconductor devices 265 on one surface of the board 220. The support table 210 is thus reconfigured to comprise jigs 280a and jigs 280b. The jigs 280b which are disposed at the sides of the middle member 272 are 'low jigs', and the jigs 280a which are disposed at the center of the middle member 272 are 'high jigs'.

The low and high jigs 280a, 280b compensate for the difference between the heights of the semiconductor devices 260, 265. Specifically, the shorter semiconductor devices 265 are supported by the upper surfaces of the high jigs 280a and the taller semiconductor devices 260 are supported by the upper surfaces the low jigs 280b, the upper surfaces being in contact with the devices 265 and 260, respectively. That is to say, the sums of the heights of each semiconductor device 260, 265 and its corresponding jig 280 are all the same. The upper surface of the upper member 271 on which the board 220 is mounted serves as the reference for measuring the heights.

Accordingly, by using the jigs 280, the board 220 can be supported regardless of the kinds of semiconductor devices which are mounted on the board 220. Now the lead material 250 can be applied onto the other surface of the board 220.

That is, a screen 230 such as a mesh or metal mask is aligned on the upper surface of the board 220. Then, the lead material 250 is provided on the screen 230 and is applied to the board 220 by the squeegee 240. Again, because the board 220 is supported by the support table 210, the board 220 can be prevented from warping.

After the lead material 250 is applied to the land patterns 224 of the other surface of the board 220 to form more leads, semiconductor devices 260, 265 are aligned on the leads and are fixed to the surface of the board 220 by a reflow soldering process. After that, a plurality of double-sided modules 290 are manufactured by scribing the board 220 into separate individual boards. The manufactured individual double-sided modules 290 are shown in FIG. 14.

In the above-described embodiment, the tall and short semiconductor devices 260, 265 were mounted on the board 220. However, semiconductor devices having the same height can be mounted on the board 220 if the double-sided module calls for such.

Figure 15:
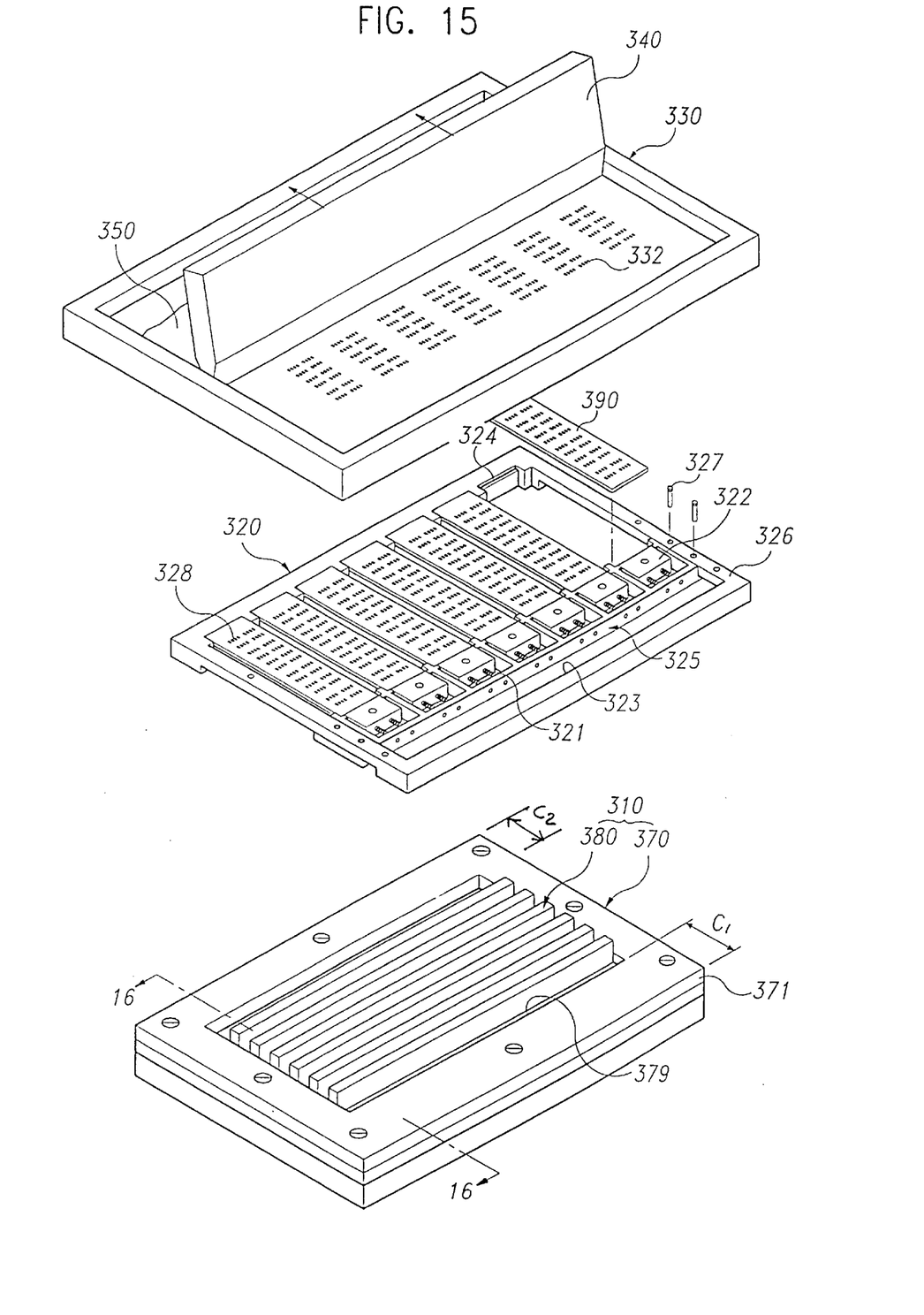
FIG. 15 is an exploded perspective view of another embodiment of equipment for screen printing a module board according to the present invention, the equipment including a support table, a fixing device which holds a plurality of individual module boards and is received on the support table, and a screen for printing a pattern on the boards as they are held by the supporting device and supported by the support table.
Figure 16:
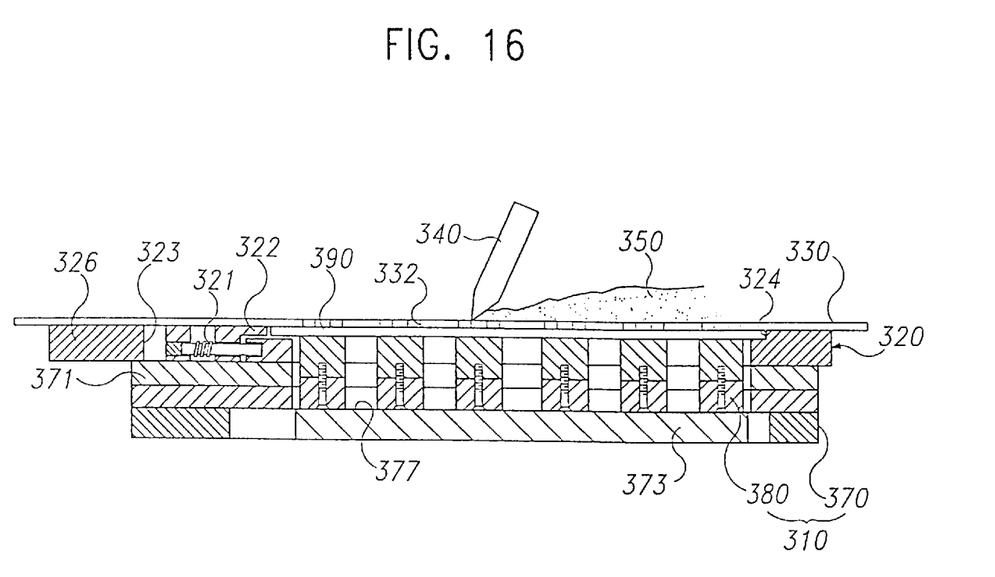
FIG. 16 is a cross-sectional view taken along line 16—16 in FIG. 15.

FIG. 15 and FIG. 16 show another embodiment of the present invention used when a plurality of the individual boards are to be loaded on the support table.

If an excessive number of the individual boards were to be connected, the resultant board would readily warp. To avoid this problem, the second embodiment of the present invention provides a fixing device 320. The fixing device 320 has a clamping body 325 which fixes respective ones of the single boards in place. In the figure, seven (7) individual boards 390 are fixed to the fixing device 320.

The fixing device 320 of the second embodiment of the present invention has a rectangular opening 323, a frame 326, the clamping body 325, and connection means 327 such as screws. A plurality of receiving grooves 324, which receive the first short sides of the individual boards 390, are formed on the frame 326 along one long side thereof. The second short sides of the individual boards 390 are received by clamps 322 attached to the clamping body 325. The clamping body 325 is fixed to both short sides of the frame 326 by the connection means 327. The clamps 322 are attached to the clamping body 325 by elastic members 321 such as springs.

The step in which the individual boards 390 are fixed to the fixing device 320 will now be described. The clamps 322 are retracted against the force of the elastic members 321 and the individual boards 390 are inserted between the clamps 322 and the side of the frame 326 defining the grooves 324. Next, the clamps 322 are released and the elastic members 321 push the boards 390 until they are snugly fit in the grooves 324 as held by the clamps 322.

In the support table 310, the distance $C_1$ between the long side of the upper member 371 of the support table 310 and the opening 379 is greater than the distance $C_2$ between the other long side of the upper member 371 and the opening 379 so that the lower surface of the clamps 322 of the fixing device 320 will rest on the upper surface of the upper member 371. The jigs 380 are inserted in the slots 377 and are fixed in place by the magnet 373.

The structure of the other elements of the second embodiment are the same as that of the first embodiment. Also, it is possible to manufacture all of the elements of the body 370, such as the lower, middle, and upper members as one integrated body, like in the first embodiment.

The lead material 350 is applied to one surface of the individual board 390 as follows. First, the support table 310 is prepared. In the support table 310, a plurality of the jigs 380 are inserted into the slots 377 of the middle member through the opening 379 of the upper member and are fixed in place by the magnet 373 which is attached to the lower surface of the middle member.

Then, the lower surface of the fixing device 320 is rested on the upper surface of the support table 310. The single boards 390, which are fixed to the fixing device 320, have no semiconductor devices mounted thereto. Because the lower surfaces of the board 390 are located above the lower surface of the fixing device 320, the jigs 380 extend beyond the opening 379 of the upper member 371. Therefore, the clamping member 325 and the frame 326 are supported by the upper surface of the upper member 371 of the support table 310 and the individual boards 390 are supported by the upper surfaces of the jigs 380.

After that, the creamy lead material 350 is applied to the land patterns 328 on one surface of the individual board 390 by using the screen 330 which is disposed on the upper surface of the fixing device 320. The lead application step of this embodiment is the same as that of the first embodiment. Note, because the boards 390 are supported by the support table 310, the boards 390 are prevented from warping.

After the screen printing step has been completed, semiconductor devices are mounted on one surface of each of the individual boards 390 like in the first embodiment shown in FIG. 11.

Figure 17:
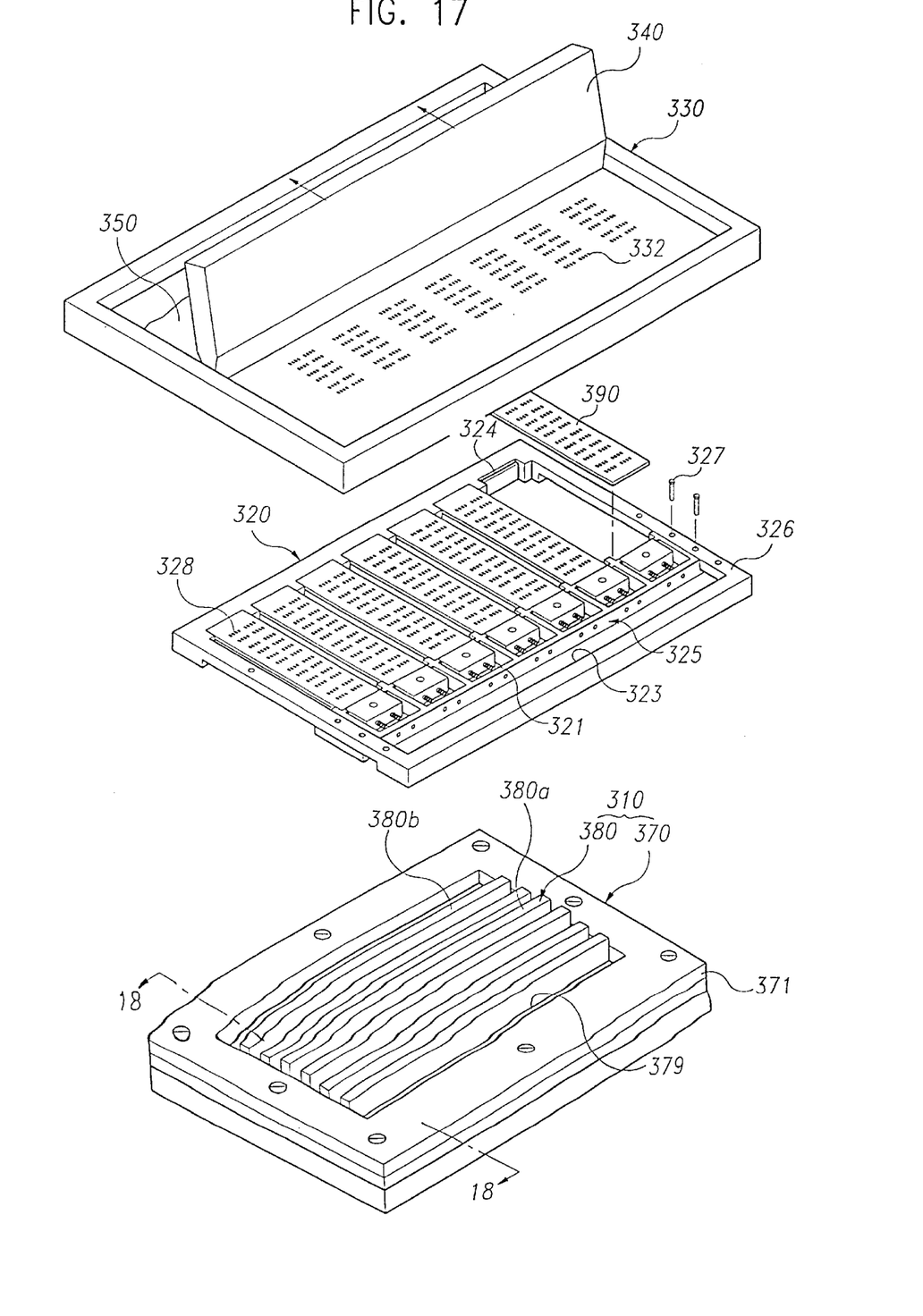
FIG. 17 is an exploded perspective view similar to that of FIG. 15 but showing the equipment set up to screen print the board once it has semiconductor devices mounted to one side thereof.
Figure 18:
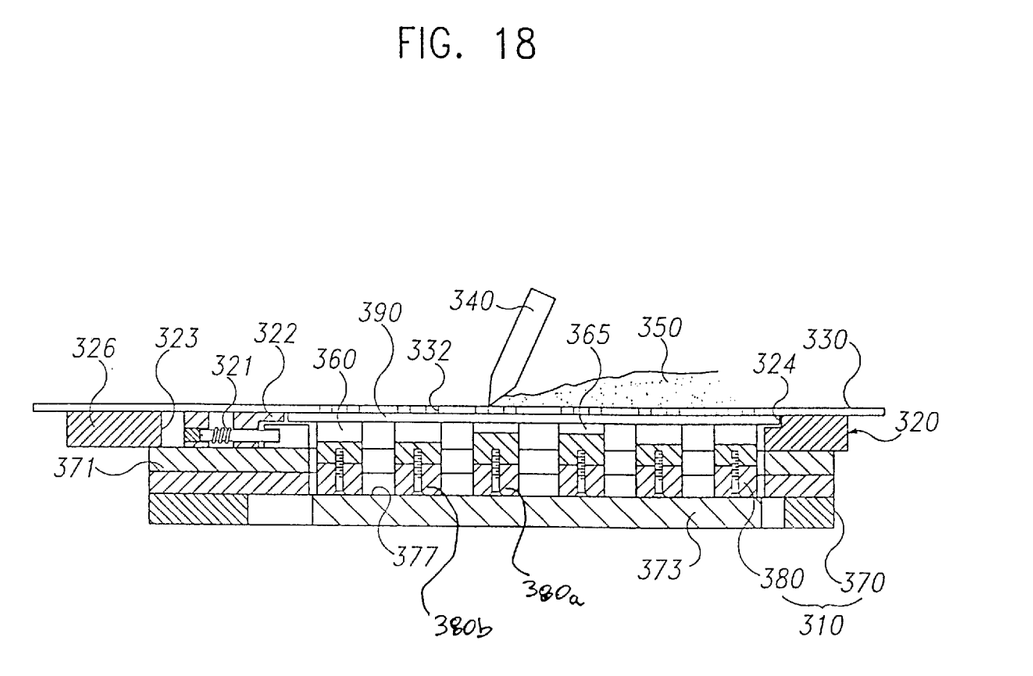
FIG. 18 is a cross-sectional view taken along line 18—18 in FIG. 17.

Next, referring to FIG. 17 and FIG. 18, high and low jigs 380a, 380b are used for compensating for the difference between the heights of the semiconductor devices 360, 365. That is to say, the shorter semiconductor devices 365 are supported by the upper surfaces of the high jigs 380a and the taller semiconductor devices 360 are supported by the upper surfaces of the low jigs 380b.

Then the second sides of the boards 390 can be provided with leads and semiconductor devices in the same manner as described in connection with the first embodiment. Accordingly, double-sided modules are formed.

The present invention does not require respective support tables which compensates for the different heights of the semiconductor devices. Rather, the present invention requires only one basic support table and supports the board(s) with jigs which can compensate for any difference in height between the semiconductor devices.

Further, the support table of the present invention can be used in manufacturing a double-sided module as well as a single-sided module. Also, the support table can support a single board and the fixing device to which a plurality of individual boards are fixed.

Although preferred embodiments of the present invention have been described in detail hereinabove, it should be clearly understood that many variations and/or modifications of the basic inventive concepts taught herein will become apparent to those skilled in the art. All such modifications and variations which fall within the scope of the appended claims are thus seen to be within the true spirit and scope of the present invention.

What is claimed is:

1. A support table for supporting a board used in the manufacture of a semiconductor module, said support table comprising:

a body having an upper surface, a lower surface, a rectangular groove defined in said upper surface, a middle portion located between said upper and lower surfaces, and a plurality of spaced apart slots extending through said middle portion and open to said rectangular groove defined in the upper surface; and a plurality of jigs which are inserted in said slots, the jigs having upper surfaces exposed adjacent said groove in the upper surface of said body so as to be capable of supporting semiconductor devices mounted to a board resting on said upper surface.

2. The support table as claimed in claim 1, wherein said body comprises a lower member in which a rectangular opening is formed, a middle member which constitutes said middle portion of the body and defines said slots, said middle member being mechanically fastened to said lower member, and an upper member in which said rectangular opening in the upper surface of the body is defined so as to expose said slots in the middle member.

3. The support table as claimed in claim 2, wherein said lower, middle and upper members have respective corresponding sides through which connection holes extend, and further comprising mechanical fasteners extending in said connection holes and mechanically fastening said members together.

4. The support table as claimed in claim 2, wherein said middle member is rectangular so as to have longer and shorter sides, and said slots extend parallel to said shorter sides.

5. The support table as claimed in claim 2, wherein each of said jigs comprises a rod which has a planar upper surface, a lower surface, and support legs extending from said lower surface of the rod at a distance from one another, said support legs being received in said slots.

6. The support table as claimed in claim 5, wherein said lower member comprises a magnet disposed within said rectangular opening and located adjacent said middle member, said magnet spanning all of said slots, and at least part of each of said jigs is magnetic such that said jigs are fixed in place in said slots by said magnet.

7. The support table as claimed in claim 6, wherein the rod of each of said jigs is of a non-magnetic material and the support legs are of a magnetic material.

8. The support table as claimed in claim 7, wherein said slots are open to said magnet, and the support legs of said jigs contact said magnet.

9. The support table as claimed in claim 7, wherein a height of said magnet is equal to a height of said rectangular opening of said lower member.

10. A support apparatus for use in manufacturing a module board, said support apparatus comprising:

a support table including a body having an upper surface, a lower surface, a rectangular groove defined in said upper surface, a middle portion located between said upper and lower surfaces, and a plurality of spaced apart slots extending through said middle portion and open to said rectangular groove defined in the upper surface;

a plurality of jigs which are inserted in said slots, the jigs having upper surfaces exposed adjacent said groove in the upper surface of said body so as to be capable of supporting semiconductor devices mounted to a board resting on said upper surface; and a fixing device including a frame, a clamping member integral with said frame and defining a central opening therewith, and a plurality of clamps mounted to said clamping member so as to be movable in said opening between said clamping member and one side of said frame, whereby said clamps are capable of clamping a plurality of individual module boards in place in said opening, said fixing device being supportable by said support table with the jigs of said support table supporting individual module boards clamped in place in the central opening of said fixing device by said clamps thereof.

11. The support apparatus as claimed in claim 10, wherein said fixing device comprises springs resiliently mounting said clamps to said clamping member.

12. The support apparatus as claimed in claim 10, wherein the frame of said fixing device defines a plurality of recesses in said one side thereof, said recesses being configured to receive first ends of individual module boards clamped in place by said clamps.

13. A method of screen printing at least one module board, said method comprising:

(a) providing a support table including a body having an upper surface, a lower surface, a rectangular groove defined in the upper surface, a middle portion located between the upper and lower surfaces, and a plurality of spaced apart slots extending through the middle portion and open to the rectangular groove defined in the upper surface, and a plurality of jigs;

(b) inserting the jigs in said slots such that upper surfaces of the jigs are exposed adjacent said groove in the upper surface of said body;

(c) disposing at least one board, on which a plurality of land patterns are formed, on the jigs of the support table;

(d) positioning a screen having hole patterns over the board such that the hole patterns are aligned with the land patterns of the board;

(e) providing lead material on the screen; and (f) pressing the lead material through the hole patterns and onto the land patterns of the board while the board is supported by the jigs of the support table.

14. The method of screen printing as claimed in claim 13, further comprising the step of fixing a plurality of individual boards in place in a row, and wherein the step of disposing comprises disposing all of the individual boards on the jigs of the support table.

15. The method of screen printing as claimed in claim 13, wherein the step of disposing comprises resting semiconductor devices mounted to one surface of the board directly on the jigs of the support table.

16. The method of screen printing as claimed in claim 15, wherein the semiconductor devices on the board have different heights, and the step of inserting comprises inserting jigs having different heights into the slots so as to accommodate for the difference in height of the semiconductor devices, whereby the board rests level on the jigs of the support table.

17. The method of screen printing as claimed in claim 13, further comprising fixing the jigs in place in the slots relative to the body of the support table.

18. The method of screen printing as claimed in claim 17, wherein the jigs comprise a magnetic material, and the step of fixing the jigs in place comprises magnetically attracting the jigs to fixed positions in the support table.

19. The method of screen printing as claimed in claim 13, wherein the step of disposing comprises resting the board directly on the jigs of the support table, and the step of pressing is carried out to form leads on one surface of the board, and further comprising the steps of:

(g) mounting semiconductor devices to the leads on the one surface of the board;

(h) removing jigs from the slots and inserting new jigs in their place having heights which, when each respectively added to the height of an associated one of the semiconductor devices, equals the height of the corresponding jig which it replaced;

(i) resting the semiconductor devices directly on the associated new jigs, respectively, so that the board is supported level by the support table;

(j) positioning a screen having hole patterns over the other surface of the board such that the hole patterns are aligned with the land patterns of the board;

(k) providing lead material on the screen; and (l) pressing the lead material through the hole patterns and onto the land patterns of the other surface of the board while the semiconductor devices are resting directly on the jigs of the support table.

20. The method of screen printing as claimed in claim 19, further comprising the step of fixing a plurality of individual boards in place in a row, and wherein the step of disposing comprises resting all of the individual boards directly on the jigs of the support table.

21. The method of screen printing as claimed in claim 19, wherein the semiconductor devices have different heights, and the step of inserting new jigs comprises inserting jigs having different heights into the slots so as to accommodate for the difference in height of the semiconductor devices.

22. The method of screen printing as claimed in claim 19, further comprising temporarily fixing all of the jigs in place relative to the body of the support table once they have been inserted into the slots.

23. The method of screen printing as claimed in claim 22, wherein the jigs comprise a magnetic material, and the step of fixing the jigs in place comprises magnetically attracting the jigs to fixed positions in the support table.

* * * * *